United States Patent
Nakajima et al.

(10) Patent No.: US 7,223,958 B2
(45) Date of Patent: May 29, 2007

(54) DEVICE FOR AND METHOD OF DRIVING AN ELECTRO-OPTICAL DEVICE

(75) Inventors: Akira Nakajima, Suwa (JP); Katsunori Yamazaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/992,002

(22) Filed: Nov. 19, 2004

(65) Prior Publication Data

US 2005/0151059 A1  Jul. 14, 2005

(30) Foreign Application Priority Data

Jan. 13, 2004  (JP)  ............................. 2004-005472

(51) Int. Cl.
- H01J 3/14 (2006.01)
- G01J 1/32 (2006.01)
- G01J 1/04 (2006.01)
- H01L 31/14 (2006.01)
- G09G 3/20 (2006.01)
- G09G 3/30 (2006.01)
- G09G 5/00 (2006.01)
- F21V 7/04 (2006.01)

(52) U.S. Cl. ............... 250/216; 250/205; 250/553; 250/227.11; 345/55; 345/77; 345/207; 362/552

(58) Field of Classification Search ............... 250/205, 250/208.1, 221, 226, 216, 227.11; 345/76, 345/77, 81, 84, 82, 63, 32, 207, 690, 697, 345/211, 212, 204; 315/10; 362/551, 552, 362/555, 561, 330, 800

See application file for complete search history.

(56) References Cited

U.S. PATENT DOCUMENTS

| | | | |
|---|---|---|---|
| 5,490,005 | A | 2/1996 | Jueliger |
| 6,710,318 | B2* | 3/2004 | Lin ............................. 250/205 |
| 6,930,737 | B2* | 8/2005 | Weindorf et al. ............. 349/96 |
| 7,064,733 | B2* | 6/2006 | Cok et al. ....................... 345/76 |
| 2003/0151569 | A1* | 8/2003 | Lee et al. ....................... 345/84 |
| 2004/0041756 | A1* | 3/2004 | Henmi et al. .................. 345/76 |
| 2005/0083323 | A1* | 4/2005 | Suzuki et al. ................ 345/207 |
| 2006/0245204 | A1* | 11/2006 | Mizuta ......................... 362/559 |

FOREIGN PATENT DOCUMENTS

| | | |
|---|---|---|
| CN | 1347074 A | 5/2002 |
| DE | 101 38 004 A 1 | 2/2003 |
| JP | A-3-44164 | 2/1991 |
| JP | A-5-227497 | 9/1993 |
| JP | A-5-294006 | 11/1993 |
| JP | A-11-282404 | 10/1999 |
| JP | A-2002-162934 | 6/2002 |

* cited by examiner

*Primary Examiner*—Georgia Epps
*Assistant Examiner*—Pascal M. Bui-Pho
(74) *Attorney, Agent, or Firm*—Oliff & Berridge, PLC

(57) ABSTRACT

To provide an electro-optical device, such as a display or a printer head having a self-luminous element, in which a light-emitting state of a light-emitting element is detected. The electro-optical device comprises a plurality of pixel units arranged in a display region on a substrate in a predetermined pattern, each including a light-emitting element; a plate-like member disposed to overlap the display region and formed of a transparent medium for transmitting light emitted from the plurality of pixel units and internally reflecting a portion of the transmitted light; and light detection means for detecting light that is internally reflected and reaches at least one side of the display region through the inside of the plate-like member.

11 Claims, 10 Drawing Sheets

DEVICE FOR AND METHOD OF DRIVING AN ELECTRO-OPTICAL DEVICE

BACKGROUND

The present invention relates to an electro-optical device such as an electroluminescent (EL) display, a plasma display panel, a light-emitting diode display panel, a field emission display panel and a printer head, a method for driving the same, and various electronic apparatuses having the electro-optical device.

This type of the electro-optical device includes a device having a light-emitting element in each pixel unit in a display region. For example, Patent Document 1 and Patent Document 2 disclose a printer head configured by linearly arranging the plurality of light-emitting elements. Among the plurality of light-emitting elements of the printer head, an optical sensor is provided for a predetermined number of light-emitting elements, and their corresponding light-emitting states are detected by the optical sensor, and the brightness of the pixel units is adjusted based on the detected light-emitting states, respectively. In particular, according to Patent Document 2, light is detected by the optical sensor, which is emitted from an end face on a side opposite to a photoreceptor of the light-emitting element.

When a display is configured using the electro-optical device, the plurality of light-emitting elements are arranged in a plane. In particular, according to Patent Document 3 and Patent Document 4, it is disclosed that external light incident on a display region of such a display is detected so that a brightness of each of pixel units is adjusted.

[Patent Document 1] Japanese Unexamined Patent Application Publication No. 3-44164

[Patent Document 2] Japanese Unexamined Patent Application Publication No. 5-294006

[Patent Document 3] Japanese Unexamined Patent Application Publication No. 5-227497

[Patent Document 4] Japanese Unexamined Patent Application Publication No. 11-282404

SUMMARY

However, according to Patent Document 1 and Patent Document 2, the optical sensor is disposed per each light-emitting element, which causes not only the manufacturing cost to be increased in a process of manufacturing the printer head, and but also complicates the manufacturing process and decreases the productivity. In addition, according to Patent Document 2, when the light-emitting element emitting light at one side is employed, the light-emitting state of this light-emitting element cannot be detected. In addition, techniques for manufacturing the optical sensor per each of pixel units using a thin film technique are being developed, however, it has not yet reached the level of being put into a practical use.

The present invention has been made in consideration of the above problems. It is therefore an object of the present invention to provide an electro-optical device, which is capable of detecting a light-emitting state of a light-emitting element per each of pixel units or external light incident on a display region by means of a simple and easy construction, a method for driving the same, and an electronic apparatus having the electro-optical device.

In order to achieve the above objects, the present invention provides an electro-optical device comprising: a plurality of pixel units arranged in a display region on a substrate in a predetermined pattern, each including a light-emitting element; a plate-like member disposed to overlap the display region and formed of a transparent medium for transmitting light emitted from the plurality of pixel units and internally reflecting a portion of the transmitted light; and light detection means for detecting light that is internally reflected and reaches at least one side of the display region through the inside of the plate-like member.

In the electro-optical device of the present invention, the plurality of pixel units are arranged in the display region on the substrate in a line or in a plane as a predetermined pattern.

In addition, the plate-like member disposed to overlap the display region is preferably arranged to face the substrate and is comprised of a sealing substrate for sealing and protecting the light-emitting elements.

When a corresponding electro-optical device is driven, the light-emitting elements in respective pixel units are turned on to emit light so that display is performed. Most of the light emitted from the pixel units transmits the plate-like member to be emitted as display light. On the other hand, a portion of the light emitted from the pixel units is not emitted as the display light, but is internally reflected within the plate-like member in an interface between the plate-like member and an air so that they reach each side of the display region through the plate-like member. The light detection means including a photo diode is disposed on a predetermined position of the substrate, and detects light that is internally reflected within the plate-like member and reaches at least one side of the display region as described above.

Accordingly, according to the electro-optical device of the present invention, the light-emitting states in the plurality of pixel units may be detected. In addition, as compared to a construction in which light detection means is disposed per a light-emitting element in each of pixel units, the electro-optical device of the present invention may be fabricated in a simple way and at a low cost. In addition, the light-emitting states may be detected even when the light-emitting element emitting light in one side are disposed in the pixel units.

In one aspect of the electro-optical device of the present invention, the plurality of pixel units are arranged in a plane as the predetermined pattern.

According to this aspect, in a display using an electro-optical device having the plurality of pixel units arranged in a plane, namely, a two-dimensional pattern, for example, the plurality of pixel units including a pixel unit for red color (R) in which a light-emitting element emits light corresponding to red color, a pixel unit for green color (G) in which a light-emitting element emits light corresponding to green color, and a pixel unit for blue color (B) in which a light-emitting element emits light corresponding to blue color, may be employed to display characters or images in a color pattern or a black and white pattern.

In other aspect of the electro-optical device of the present invention, the plurality of pixel units are arranged in a line as the predetermined pattern.

According to this aspect, an electro-optical device having the plurality of pixel units arranged in a line, namely, in a one-dimensional manner may be employed to configure, for example, a line printer head. In this case, each of the pixel units arranged in a line is selectively turned on to allow light emitted from each of the pixel units to be radiated on the photoreceptor. An image formed on a surface where the light is radiated on the photoreceptor is developed by a toner, so that the image is transferred onto a printing sheet by a transcriber.

Alternatively, when the light detection means is respectively disposed at both ends of the plurality of pixel units arranged in a line, light guide means to be described later becomes unnecessary.

In another aspect of the electro-optical device of the present invention, the electro-optical device further comprises light guide means for guiding light that is internally reflected and emitted from the plate-like member along the at least one side, and the light detection means is disposed at one end of the at least one side and detects light guided by the light guide means along the at least one side.

According to this aspect, the light guide means, for example, is formed of a transparent medium in which acryl is employed for the transparent medium, and light that is internally reflected within the plate-like member and reaches the one side of the display region and is emitted from the plate-like member may be incident on the light guide means, so that the loss of light until it propagates from the one side of the display region to the light detection means, may be reduced. Accordingly, light that has reached the one side of the display region may be surely and efficiently detected. In particular, when a large-scale display is configured employing the electro-optical device in which the plurality of pixel units are arranged in the plane, it is preferable to dispose the light guide means.

In addition, a reflective sheet or a diffusing sheet may be disposed with respect to the light guide means. According to this construction, the loss of light until it reaches the light detection means through the light guide means may be further reduced.

Preferably, a space is formed in the plate-like member with respect to a surface where light reaching one side of the display region is emitted, which allows the light guide means to be disposed in the space. As a result, light emitted from the plate-like member may be incident on the light guide means at a large angle.

In this aspect that the light guide means is disposed, the plate-like member may be comprised of a sealing substrate for sealing the light-emitting element, and the transparent medium may be formed of a transparent material having a smaller refractive index than that of the light guide means.

According to this construction, light incident into the light guide means may be incident on an interface between the light guide means and the plate-like member at a larger angle than the threshold angle when the light guide means is disposed adjacent to a surface where light that reaches one side of the display region is emitted in the plate-like member, so that the light may be totally reflected within the light guide means. In other words, it is possible to allow light to be totally reflected within the light guide means to be propagated to the light detecting similar to a case of employing an optical fiber, so that the loss of light until it reaches the light detection means through the light guide means is reduced, which leads to an increase in detecting then amount of detectable light by means of the light detection means.

In another aspect of the electro-optical device of the present invention, the electro-optical device further comprises a driving unit for generating a driving signal for allowing each of the plurality of the pixel units to be turned on to emit light, and supplying it to each of the plurality of pixel units.

According to this aspect, a predetermined amount of current is supplied to each pixel unit based on the driving signal, and the light-emitting element emits light according to the supplied current. Accordingly, it is possible to adjust the brightness of each pixel unit by adjusting the supplied amount of current and supplying driving signals to the plurality of pixel units, respectively when the driving signals are generated by the driving unit.

In this aspect further comprising the driving unit, the light detection means further includes a control unit for generating a correction signal for correcting the light-emitting of the pixel units and supplying it to the driving unit based on the detected signal output according to the detection of light, and the driving unit may also be configured to correct the driving signal based on the correction signal.

According to this construction, it is possible to adjust the brightness of the pixel unit based on the light-emitting state of each of the pixel units.

In this case, the light-emitting element in each pixel unit deteriorates due to the driving of the electro-optical device, so that its light-emitting state is also changed. When the line printer head is configured using the corresponding electro-optical device in which the plurality of pixel units are arranged in a line, it may be impossible to perform a good printing due to the deterioration of the light-emitting element in each pixel unit. Alternatively, when the display is configured using the corresponding electro-optical device in which the plurality of pixel units are arranged in a plane, the lifetime of the light-emitting element in each of various pixel units for red color (R), green color (G), and blue color (B) is different from one another. Accordingly, in order to display a good image, it is required to detect the degree of deterioration of the light-emitting element per each of various pixel units for R, G, and B colors, and correct its light-emitting.

According to this aspect, a detection signal of the current value corresponding to the amount of light detected by the light detection means is output from the light detection means. The control unit detects the light-emitting state of each pixel unit from the current value of the detection signal, and generates a correction signal. The driving unit, for example, adjusts the current value of the driving signal based on the correction signal, and outputs the driving signal.

According to this aspect, when the printer head is configured using the corresponding electro-optical device, the brightness of each pixel unit may be adjusted to thereby perform a good printing.

In addition, when the display is configured using the electro-optical device, the degree of deterioration in each of pixel units for R, G, and B colors may be detected to thereby correct the brightness of each pixel unit. Accordingly, it is possible to display a high quality image in the display region.

In the aspect in which the driving signal based on the correction signal is corrected, of external light incident on the plate-like member when the plurality of pixel units are turned off, the light detection means may detect the light that is internally reflected within the plate-like member and reaches at least one side of the display region through the inside of the plate-like member.

According to this construction, it is possible to detect the external light incident on the plate-like member in the display region. The control unit detects the amount of external light incident on the plate-like member from the current value of the detection signal, and generates the correction signal. The current value of the driving signal is then adjusted based on the correction signal in the driving unit, so that the brightness of each pixel unit may be increased when a large amount of external light is incident on the plate-like member, and it may be decreased when a small amount of external light is incident on the plate-like member.

In the aspect in which the amount of light reaching at least one side of the display region, of external light incident on the plate-like member when the plurality of pixel units, is turned off is detected, the control unit may calculate a light intensity detected by the light detection means when the pixel units are turned off and a light intensity detected by the light detection means when the pixel units are turned on, based on the detected signal, and generates the correction signal based on a value obtained by subtracting the light intensity calculated when the pixel units are turned off from the light intensity calculated when the pixel units are turned on.

According to this construction, the control unit may eliminate external light components of the light detected by the light detection means when each pixel unit is turned on, which allows the light-emitting state of each pixel unit to be accurately detected.

In the aspect in which the correction signal is generated based on a value obtained by subtracting the light intensity calculated when the pixel units are turned off from the light intensity calculated when the pixel units are turned on, the light detection means is disposed at each of two sides of the display region, and the control unit obtains first and second values as values based on each of the detected signals output from the two light detection means, determines whether or not the sum of the first and second values is constant, and generates the correction signal when it is determined that the sum is not constant.

According to this construction, the brightness of each pixel unit may be properly adjusted if necessary. The sum of the first and second values is constant when the light-emitting state of each pixel unit is good, however, the sum differs from the constant value due to the deterioration of the light-emitting element. In this case, the driving unit may adjust the current value of the driving signal based on the correction signal generated by the control unit, and output the driving signal.

In order to achieve the above objects, the present invention provides an electronic apparatus comprising the above-mentioned electro-optical device (it is noted herein that various aspects thereof are included).

The electronic apparatus of the present invention is configured to include the above-mentioned electro-optical device of the present invention, so that various electronic apparatuses such as a projection display, a television, a mobile phone, an electronic note, a word processor, a view finder type or monitor direct view type video tape recorder, a workstation, a picture phone, a point-of-sale (POS) terminal, a touch panel, and so forth, which are capable of displaying a high-quality image in a display region, may be implemented. In addition, an electrophoresis apparatus such as an electronic paper, a field emission display, and a conduction electron-emitter display may be implemented for the electronic apparatus of the present invention.

In order to achieve the above objects, the present invention provides a method for driving an electro-optical device including a plurality of pixel units arranged in a display region on a substrate in a predetermined pattern, each including a light-emitting element, and a plate-like member disposed to overlap the display region and formed of a transparent medium for transmitting light emitted from each of the pixel units and reflecting a portion of the transmitted light, the method comprising the steps of: detecting light that is internally reflected and reaches at least one side of the display region through the inside of the plate-like member; generating a correction signal for correcting light emitting of each of the pixel units based on the amount of detected light; and generating a driving signal for allowing each of the pixel units to be turned on to emit light based on the correction signal.

According to the method for driving the electro-optical device of the present invention, similar to the above-mentioned electro-optical device, the brightness of each pixel unit may be adjusted, so that a printer head capable of performing a good printing, or a display capable of displaying a high-quality image may be implemented.

These functions and advantages will be apparent from the preferred embodiments of the following description.

DETAILED DESCRIPTION OF EMBODIMENTS

Hereinafter, preferred embodiments of the present invention will be described in detail with reference to the accompanying drawings. The following embodiments refer to a case that the electro-optical device of the present invention is applied to an organic EL device.

<1: First Embodiment>

A first embodiment according to the electro-optical device of the present invention will be described with reference to FIGS. 1 to 8. In the present embodiment, a description is made on a display having the organic EL device.

<1-1: Construction of Electro-Optical Device>

Figure 1:
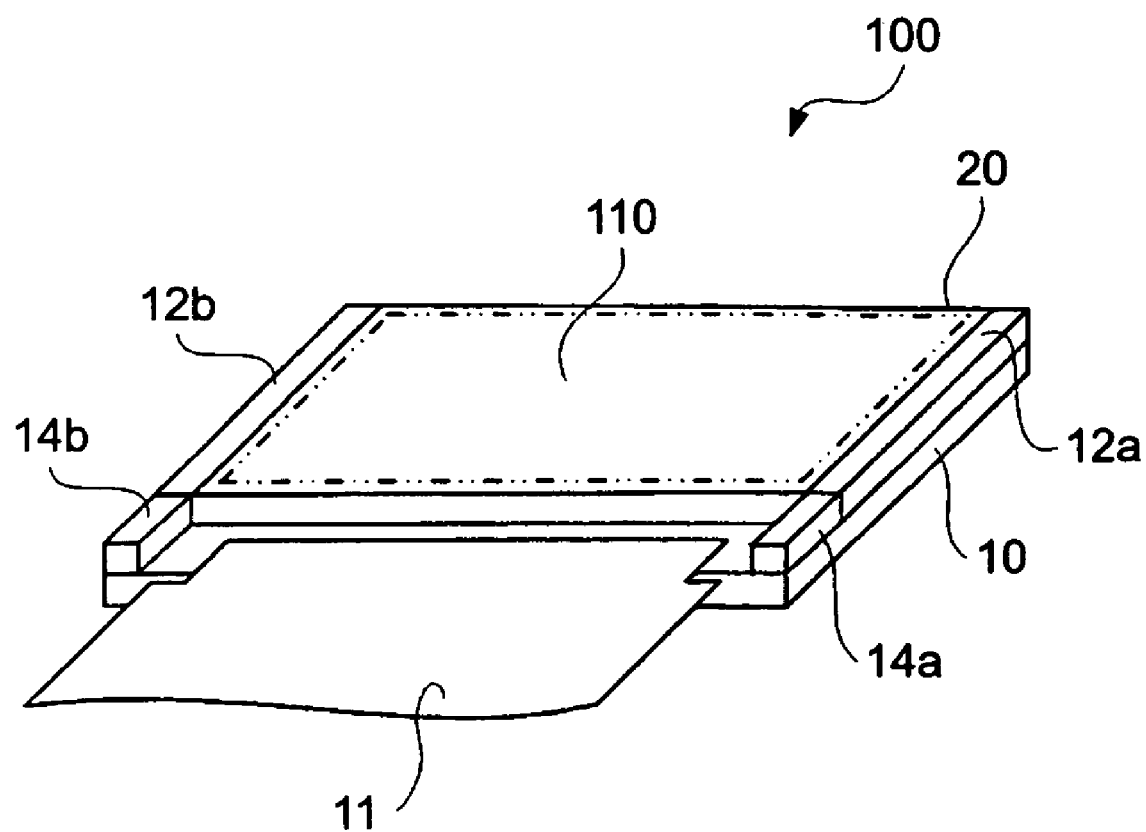
FIG. 1 is a perspective view showing a general construction of an organic EL panel.
Figure 2:
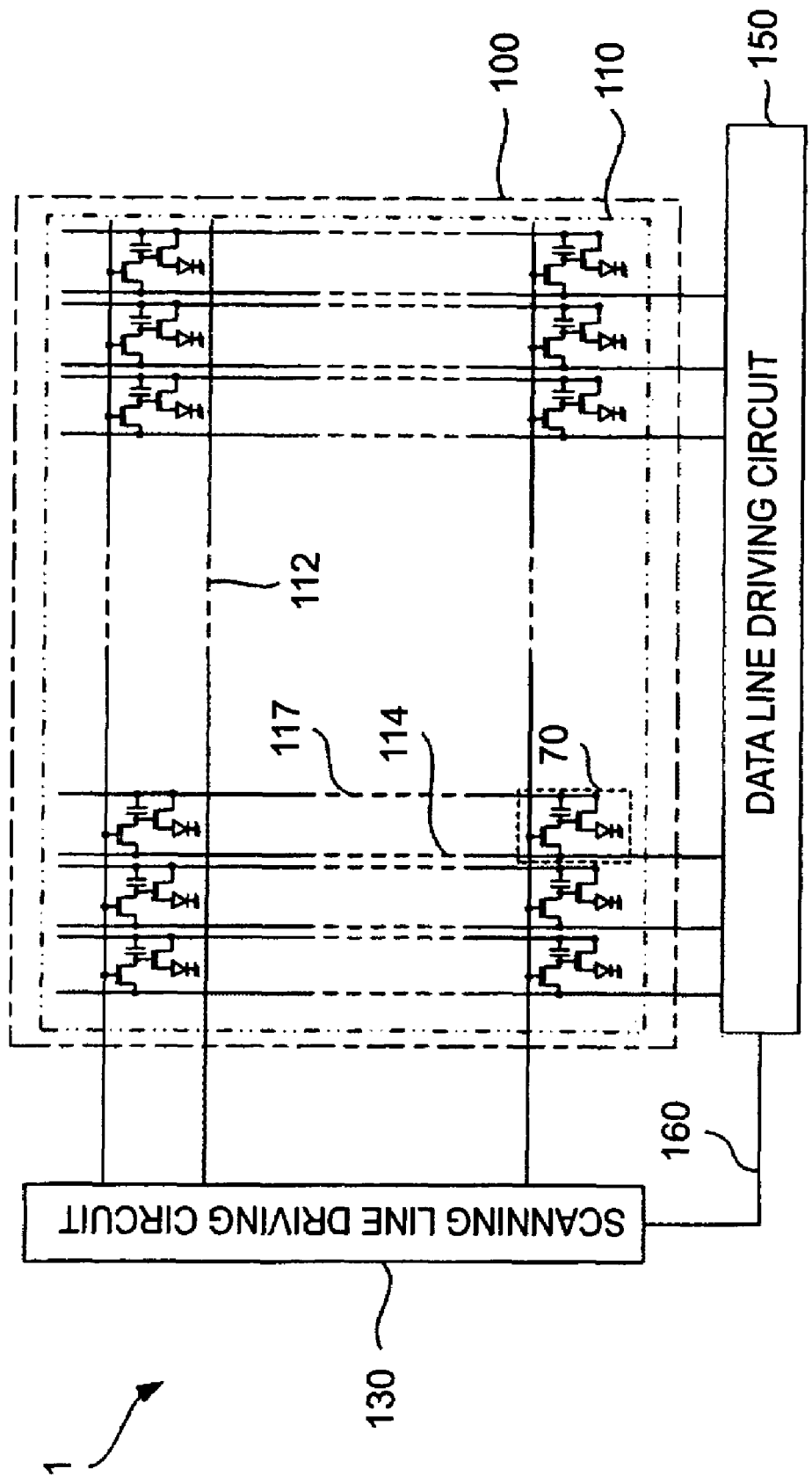
FIG. 2 is a block diagram showing a general construction of an organic EL device.
Figure 3:
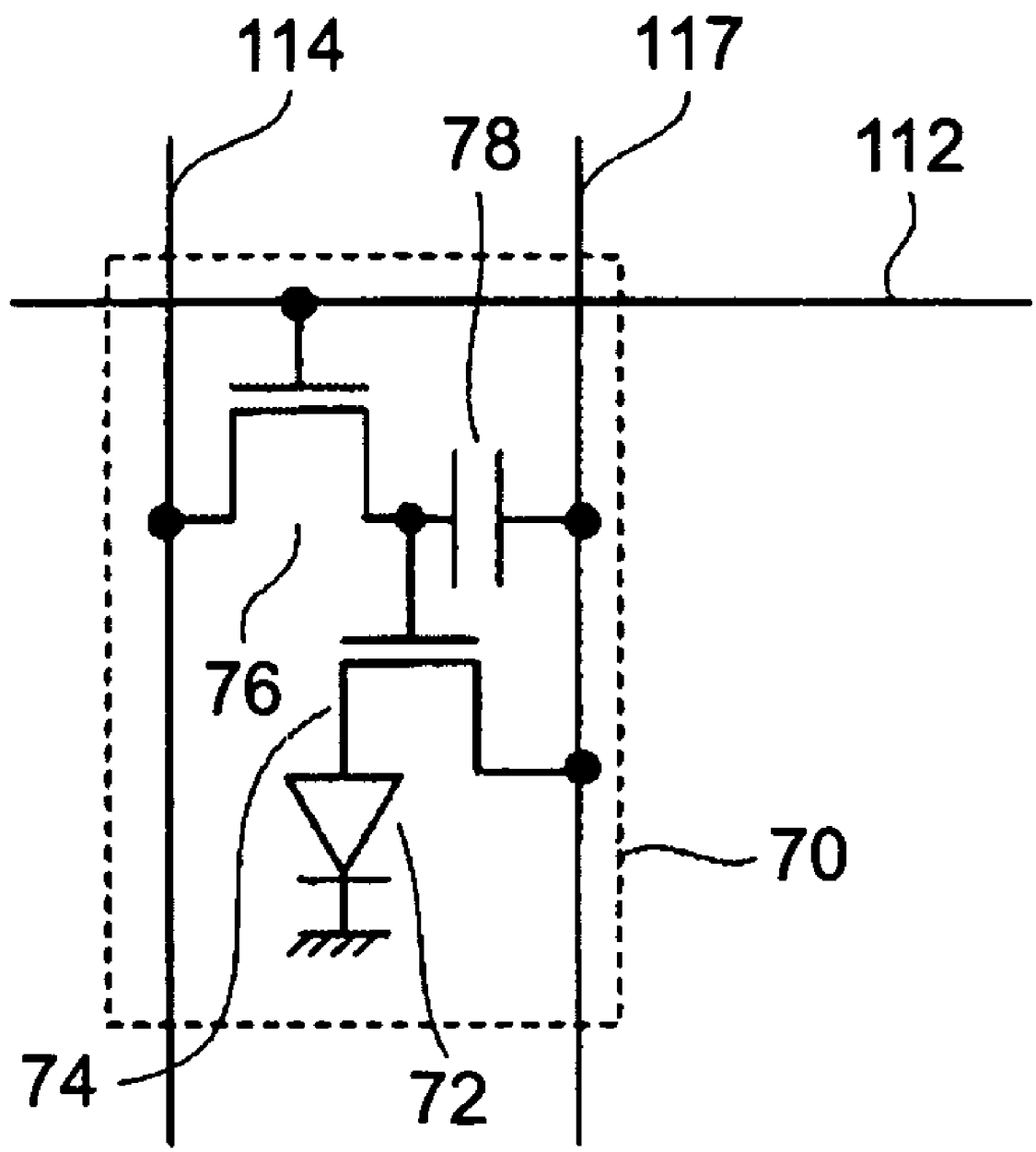
FIG. 3 is a circuit diagram showing a circuit structure of a pixel unit.
Figure 4A:
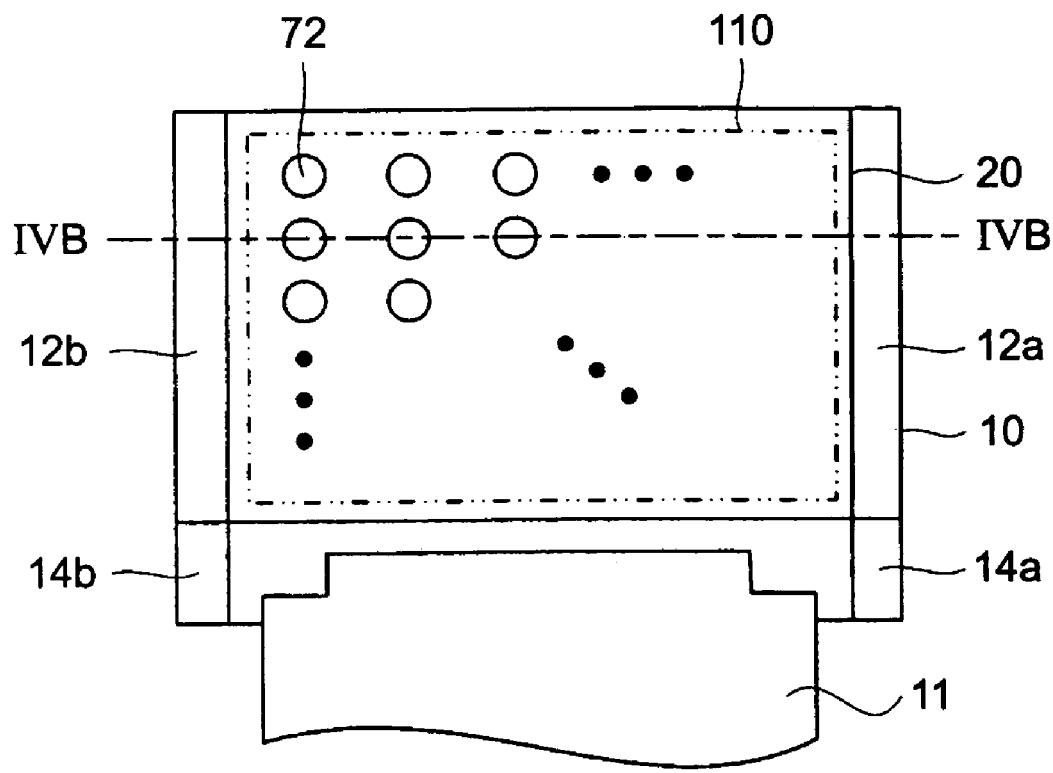
FIG. 4A is a schematic plan view of an organic EL panel when an element substrate is viewed from a sealing substrate.
Figure 4B:
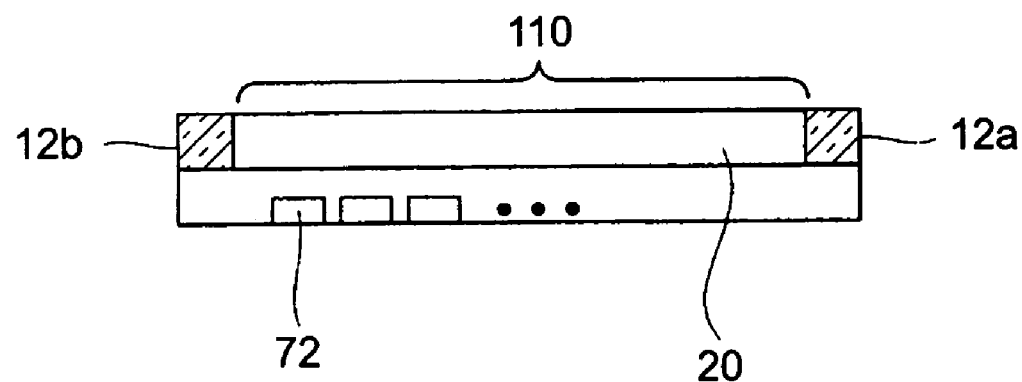
FIG. 4B is a schematic sectional view taken along the line IVB—IVB of FIG. 4A.
Figure 5:
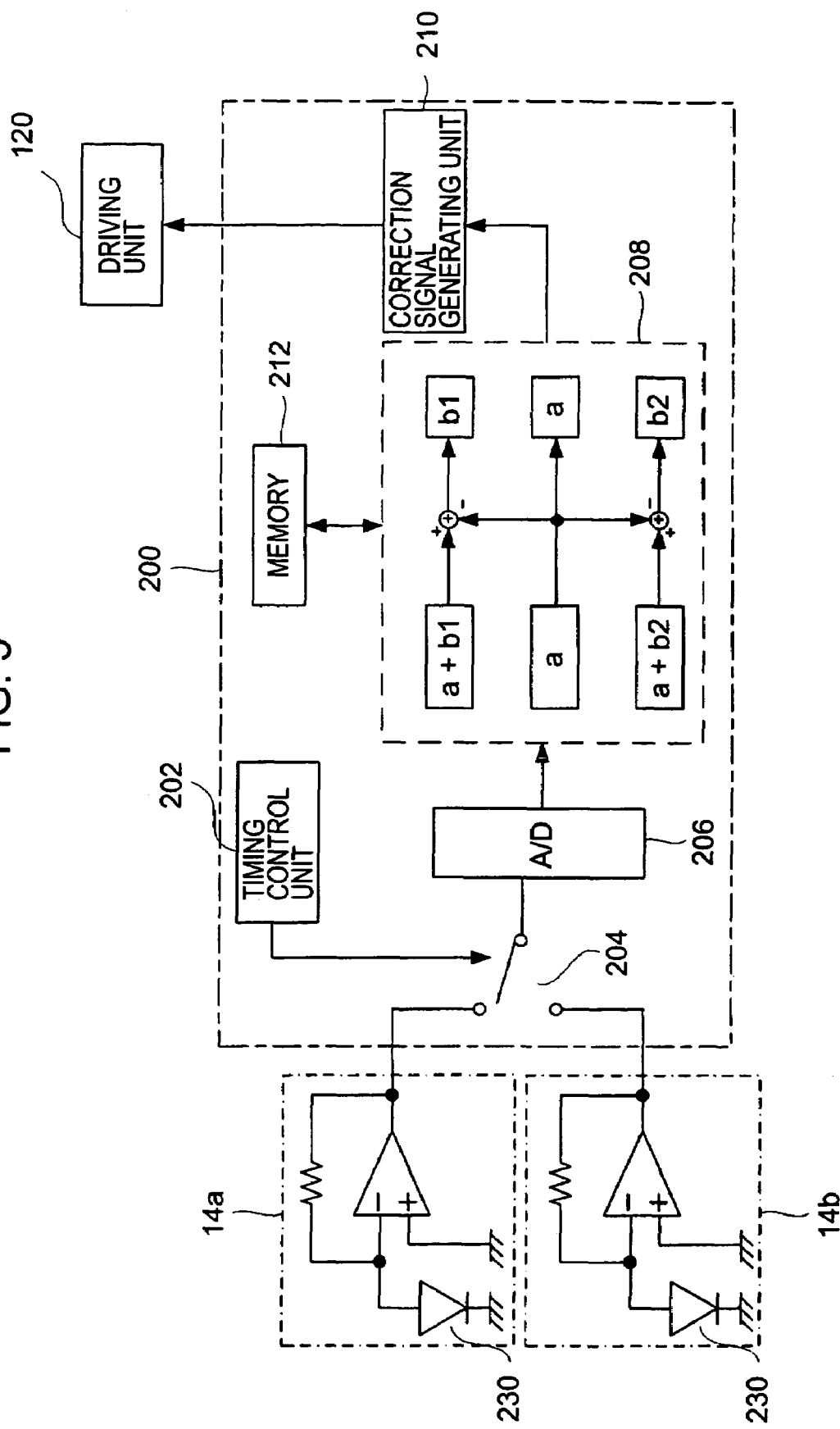
FIG. 5 is a block diagram showing a construction of a control unit.

First, a construction of the organic EL device will be described with reference to FIGS. 1 to 5. FIG. 1 is a perspective view showing a general construction of an organic EL panel in the organic EL device, FIG. 2 is a block diagram showing a general construction of the organic EL panel. FIG. 3 is a circuit diagram showing a circuit structure of a pixel unit. FIG. 4A is a schematic plan view of an organic EL panel in which an element substrate is viewed from a sealing substrate, FIG. 4B is a schematic sectional view taken along the line IVB—IVB of FIG. 4A. In addition, FIG. 5 is a block diagram showing a construction of a control unit in the organic EL device.

In the organic EL panel 100 shown in FIG. 1, a plurality of pixel units are arranged on an image display region 110 of an element substrate 10, which is referred to as a "display region" according to the present invention, in a plane in a predetermined pattern, namely, in a two-dimensional pattern. Each of the plurality of pixel units includes an organic EL device as one example of the "light-emitting element" according to the present invention to be described later.

The sealing substrate 20 is configured employing a plate-like member formed of a transparent medium, and is disposed to overlap the image display region 100 and to face the element substrate 10. By means of this construction, the organic EL device of each pixel unit is sealed by the sealing substrate 20.

In addition, light guide plates 12a and 12b are disposed at both sides of the sealing substrate 20 on the element substrate 10 in FIG. 1, which are examples of the "light guide means" according to the present invention. In addition, light detection means 14a and 14b corresponding to the light guide means 12a and 12b are disposed on the element substrate 10, respectively.

Each of the light guide plates 12a and 12b is formed of a transparent medium such as acryl. In this case, the transparent medium constituting the sealing substrate 20 is preferably formed of a transparent material having a smaller refractive index than that of the light guide plates 12a and 12b.

In the present embodiment, a scanning line driving circuit and a data line driving circuit, which are to be described later as examples of the "driving unit" according to the present invention, are built in the organic EL panel 100, and a driving integrated circuit (IC) for supplying various signals such as an image signal, a clock signal, various control signals, a power signal, etc. is mounted in these driving circuits by means of Tape Automated Bonding (TAB). In this case, in a peripheral region located at the periphery of the image display region 110 on the element substrate 10, a plurality of external circuit connecting terminals (not shown in FIG. 1) are disposed along one side of the image display region 110 in a portion of a surface exposed from the sealing substrate 20, and a flexible substrate 11 is mounted with respect to the plurality of external circuit connecting terminals.

Next, a general construction of the organic EL device 1 will be described with reference to FIG. 2. The organic EL device 1 essentially includes an organic EL panel 100, a scanning line driving circuit 130, and a data line driving circuit 150.

Data lines 114 and scanning lines 112 wired in a matrix are disposed in the image display region 110 of the organic EL panel 100, and pixel units 70 corresponding to respective intersections of the data lines and the scanning line are arranged in a matrix. In addition, a power line 117 corresponding to each pixel unit 70 arranged with respect to each data line 114 is disposed in the image display region 110.

Next, a construction of the pixel unit 70 will be described with reference to FIG. 3. In FIG. 3, not only an organic EL element 72 but also a switching transistor 76 comprised of TFT, a driving transistor 74 comprised of TFT, and a storage capacitor 78 is disposed in the pixel unit 70.

The scanning line 112 is electrically connected to a gate electrode of the switching transistor 76, a data line 114 is electrically connected to a source electrode of the switching transistor 76, and a gate electrode of the driving transistor 74 is electrically connected to a drain electrode of the switching transistor 76. In addition, the power line 117 is electrically connected to a source line of the driving transistor 74, and the organic EL element 72 is electrically connected to a drain electrode of the driving transistor 74.

In addition to the construction of the pixel circuits shown in FIGS. 2 and 3, it is possible to employ various types of pixel circuits such as a current program type pixel circuit, a voltage program type pixel circuit, a voltage comparison type pixel circuit, a sub-frame type pixel circuit, etc.

In FIG. 2, in order to implement a color display, three types of pixel units such as a red color (R) pixel unit 70 including the organic EL element 72 for emitting light corresponding to red color, a green color (G) pixel unit 70 including the organic EL element 72 for emitting light corresponding to green color, and a blue color (B) pixel unit 70 including the organic EL element 72 for emitting light corresponding to blue color, are preferably disposed in the image display region 110. More particularly, three types of pixel units 70 are disposed per three adjacent data lines 114. Any one of the three types of pixel units 70 is disposed in any one of the three data lines 114. Accordingly, three types of data lines 114 are arranged to correspond to three types of pixel units 70 in the image display region 110.

In FIGS. 4A and 4B, the organic EL elements 72 arranged in the image display region 110 are schematically shown. In FIG. 4B, the organic EL element 72 is formed in each pixel unit 70 in accordance with the arrangement pattern of the plurality of pixel units 70. In FIG. 4A, pixel units 70 are arranged in the image display region 110 in a matrix as described above, so that the organic EL elements 72 formed in respective pixel units 70 are arranged in a plane.

In FIG. 4A, the light guide plates 12a and 12b are arranged at right and left sides on the element substrate 10. Each of the light guide plates 12a and 12b is disposed adjacent to one side of the sealing substrate 20 along and opposite to one side of the element substrate 10. Accordingly, each of the light guide plates 12a and 12b is disposed on the element substrate 10 along the one side of the image display region 110 corresponding to the one side of the adjacent sealing substrate 20.

In addition, a reflective sheet or a diffusive sheet may be arranged at any one side or both sides of the light guide plates 12a and 12b. By means of this construction, as will be described later, the loss of light until it reaches the light detection means 14a and 14b through the light guide plates 12a and 12b may be further reduced. In addition, each of the light guide plates 12a and 12b may be disposed in a space that is an empty portion of the sealing substrate 20 with respect to one side of the sealing substrate 20.

According to this construction, light emitted from the sealing substrate 20 as described later, is incident on the light guide plates 12a and 12b at a large angle, so that light may be totally reflected within the light guide plates 12a and 12b. Accordingly, the amount of light emitted toward the light detection means 14a and 14b may be increased.

In addition, referring to the light guide plate 12a of the two light guide plates 12a and 12b, of two sides adjacent to one side of the light guide plate 12a along one side of the image display region 110, the corresponding light detection means 14a is disposed adjacent to one side of a portion of the element substrate 10 on which a flexible substrate 11 is mounted. In addition, referring to the light guide plate 12b, the corresponding light detection means 14b is also arranged as in the light guide plate 12a. Accordingly, each of the two light detection means 14a and 14b is arranged at an end of one side of the image display region 110.

Referring back to FIG. 1, the flexible substrate 11 is mounted on the external circuit connecting terminal arranged at the periphery of the element substrate 10. In addition, an IC or a large scale integrated circuit (LSI) comprised of the scanning line driving circuit 130 and the data line driving circuit 150 may be mounted on the organic EL panel 100 by means of chip-On glass (COG). In addition, a portion of the data line driving circuit 130 may be mounted on the flexible substrate 11.

In FIG. 2, the scanning line driving circuit 130 sequentially supplies a scanning signal for activating the scanning line 112 wired in the image display region 110 to the scanning line 112 as the driving signal based on various signals supplied from the driving IC, and the data line driving circuit 150 supplies three types of R, G, and B image signals to the data line 114 wired in the image display region 110 as the driving signal. In addition, operations of the scanning line driving circuit 130 and the data line driving circuit 150 are synchronized with each other by the synchronization signal 160.

In the present embodiment, a control unit 200 for controlling the image display carried out in the image display region 110 is further included in the organic EL device 1. In the present embodiment, the control unit 200 is built in the IC or LSI, and the IC or LSI is mounted on the flexible substrate 11 so that the control unit is disposed on the organic EL device 1. In addition, the control unit 200 may be formed on the element substrate 10 along with the scanning line driving circuit 130 and the data line driving circuit 150 or may be formed separately from these circuits.

A construction of the control unit 200 will be described with reference to FIG. 5. The two light detection means 14*a* and 14*b* preferably have the same construction as each other. Referring to the light detection means 14*a* between the two means 14*a* and 14*b*, the light detection means 14*a* is configured as an inversion amplifying circuit including a photo diode 230. Light is detected by the photo diode 230 in the light detection means 14*a*, and a detection signal of a current value corresponding to the amount of the detected light is output from the light detection means 14*a*.

A switch 204, a timing control unit 202, an A/D converter 206, an operating unit 208, a memory 212, and a correction signal generating unit 210 are disposed in the control unit 200. Any one of the two light detection means 14*a* and 14*b* is selected by the switch 204. The timing control unit 202 controls the operation of the switch 204 to control input timing of the detection signal output from each of the two light detection means 14*a* and 14*b* to the control unit 200. The detection signal input through the switch 204 is converted into a digital signal in the A/D converter 206, which is input to the operating unit 208. A predetermined operation is carried out in the operating unit 208, and its operating result is stored in the memory 212 while it is output to the correction signal generating unit 210. A correction signal is generated by the correction signal generating unit 210 based on the input operating result, which is then output to the driving unit 120 including the scanning line driving circuit 130 and the data line driving circuit 150.

In the present embodiment, as is shown in FIG. 1 or FIG. 4A, the light detection means 14*a* and 14*b* and the flexible substrate 11 mounted with respect to the external circuit connecting terminal are disposed close to each other, so that signal lines connected to the two light detection means 14*a* and 14*b* and connected to the wiring line on the flexible substrate 11 through the external circuit connecting terminal may be properly wired on the element substrate 10.

In addition, in FIG. 1 or FIG. 4A, light guide plates may be disposed at right and left sides of the image display region 110 while light detection means corresponding to the light guide plates may also be disposed at ends of an upper side of the image display region 110. According to this construction, it is possible to more accurately detect the light-emitting state of each pixel unit 70 during the operation of the organic EL device 1 as described later.

<1-2: Operation of Electro-Optical Device>

Figure 6A:
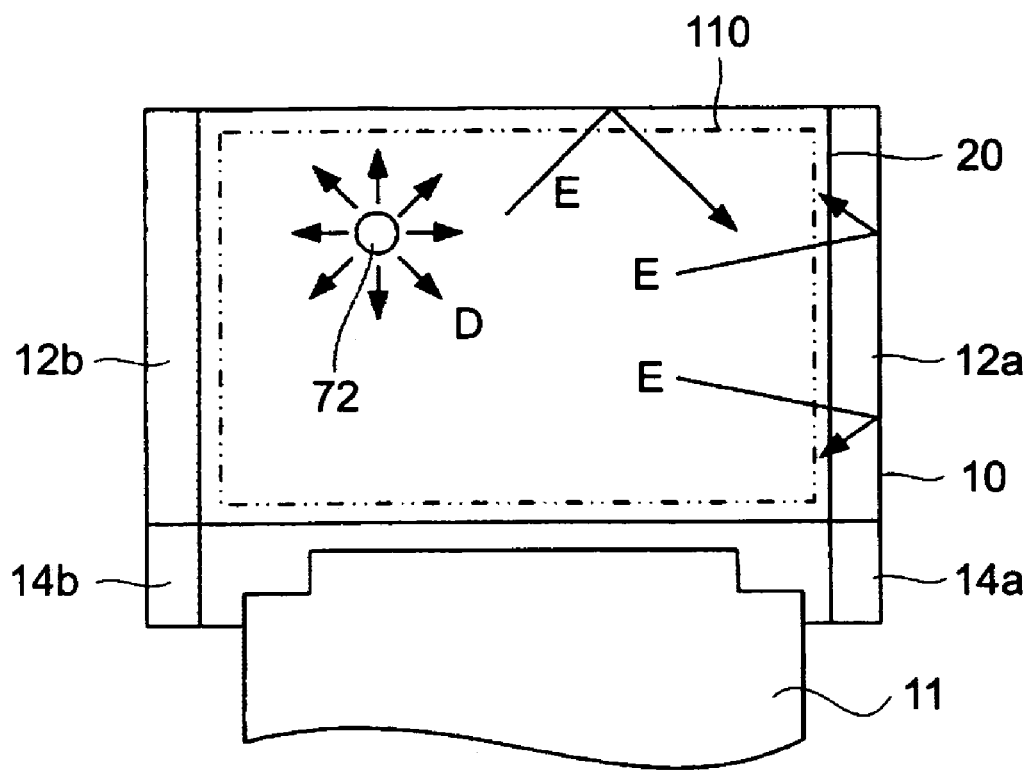
FIGS. 6A and 6B are diagrams for explaining light emitted from a light-emitting element.
Figure 6B:
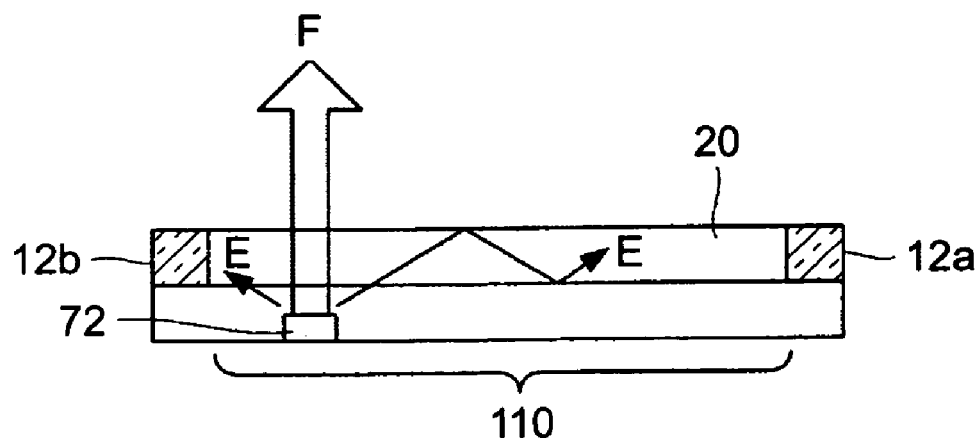
Figure 7:
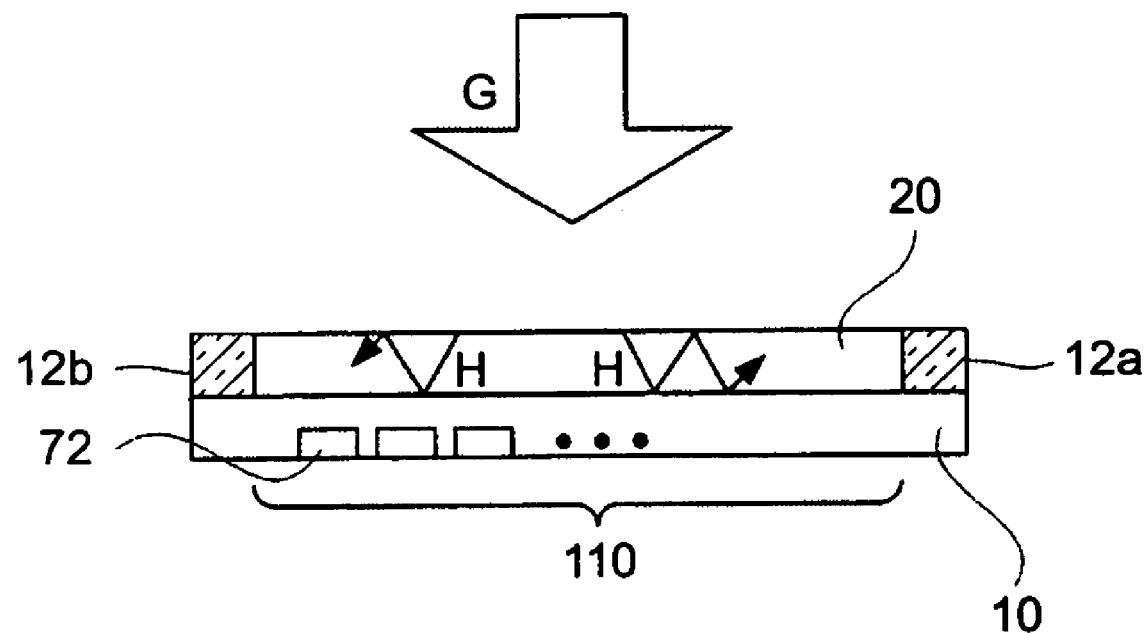
FIG. 7 is a diagram for explaining external light incident on a sealing substrate.
Figure 8:
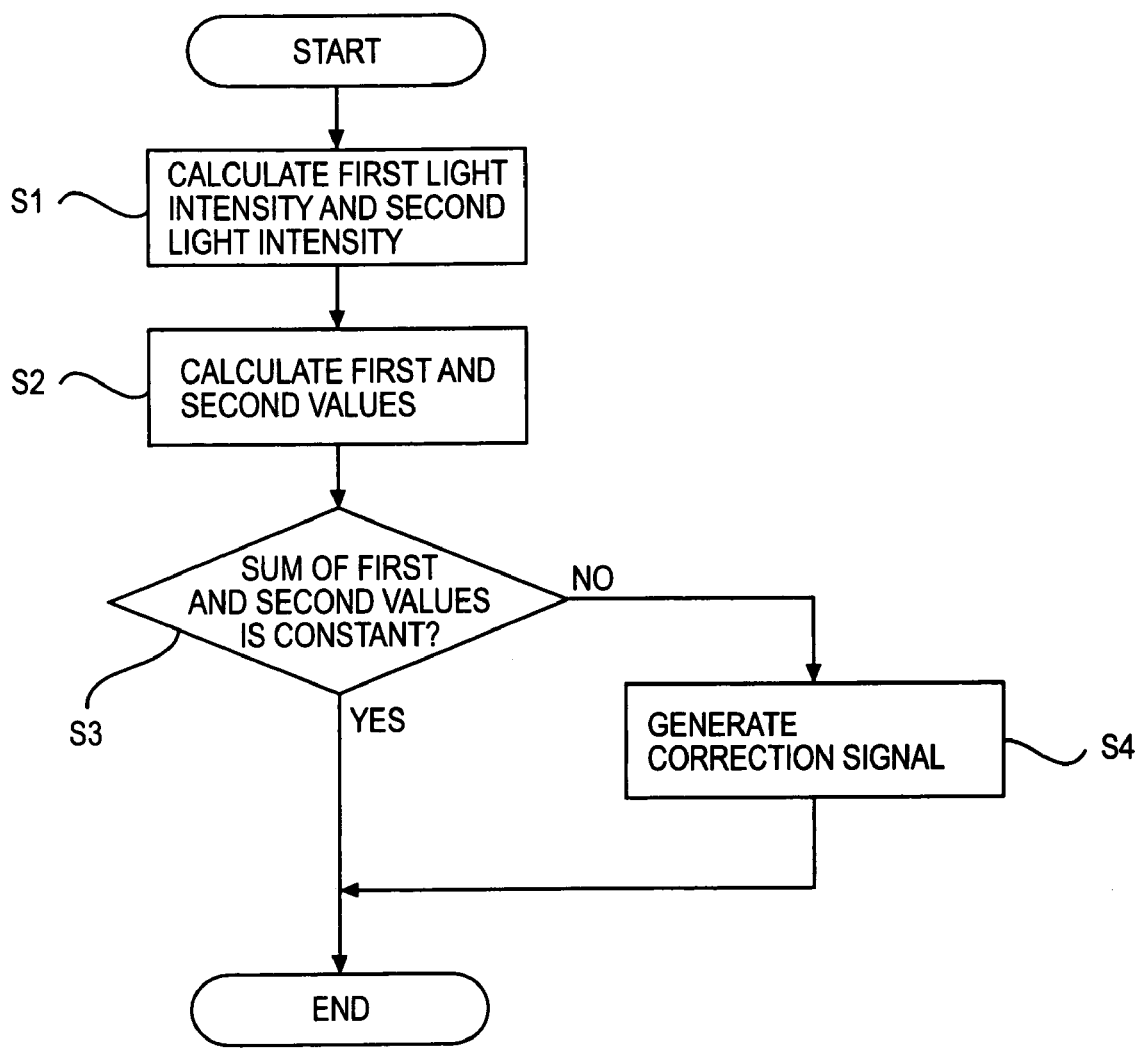
FIG. 8 is a flowchart for explaining operations of a control unit.

Next, the operation of the organic EL device 1 will be described with reference to FIGS. 6 to 8 in addition to FIG. 1 to FIG. 5. FIG. 6A is a plan view similar to FIG. 4A, and FIG. 6B is a plan view similar to FIG. 4B, which explains light emitted from the light-emitting element 72. FIG. 7 is a plan view similar to FIG. 4B, which explains external light incident on the sealing substrate 20. In addition, FIG. 8 is a flowchart for explaining the operation of the control unit 200.

In the present embodiment, by the driving unit 120 including the scanning line driving circuit 130 and the data line driving circuit 150, each of the plurality of pixel units 70 is turned on to display a test pattern on the image display region 110. In this case, it is assumed that each pixel unit 70 is turned on per each of R, G, and B types.

First, a description will be made on the case that the R pixel unit 70 is turned on. An R image signal is supplied from the data line driving circuit 150 to the R pixel unit 70 and the corresponding data line 114.

When a scanning signal is supplied from the scanning line driving circuit 130 to the corresponding scanning line 112 to have the scanning line 112 driven, the switching transistor 76 shown in FIG. 3 is turned on in the R pixel unit 70. When the switching transistor 76 is turned on, the R image signal supplied from the corresponding data line 114 is written in the storage capacitor 78. In accordance with the current of the R image signal written in the storage capacitor 78, the electrical conductive state of the driving transistor 74 is determined. According to the R image signal written in the storage capacitor 78, a current is supplied from the corresponding power line 117 through a channel of the driving transistor 74 to the organic EL element 72. The organic EL element 72 emits light corresponding to the red color according to the supplied current.

In FIG. 6B, most of the light emitted from the organic EL element 72 is emitted through the sealing substrate 20 as display light as indicated by the arrow F. In FIG. 6A, there exists light transmitted in all directions as indicated by the arrow D when the image display region 110 is viewed from a plan view, which is mixed with the light emitted from the organic EL element 72. Referring to FIGS. 6A and 6B, as indicated by the arrow E, a portion of light other than the display light emitted from the organic EL element 72 is internally reflected in the sealing substrate 20 so that they reach right and left sides of the image display region 110 through the sealing substrate 20.

Light that has reached the right side between the right and left sides of the image display region 100 are emitted from an end face of the sealing substrate 20 along the right side, and are incident on the light guide plate 12*a* disposed along the right side. The light incident into the light guide plate 12*a* is incident on an interface between the light guide plate 12*a* and the sealing substrate 20 at a larger angle than the threshold angle, so that they are totally reflected within the light guide plate 12*a*. By means of this total reflection, light propagating along the right side of the image display region 110 within the light guide plate 12*a* is emitted from the light guide plate 12 and is incident on the light detection means 14*a*.

In the light detection means 14*a* shown in FIG. 5, light emitted from the light guide plate 12*a* is detected by the photo diode 230. Accordingly, the loss of light, which reaches the right side of the image display region 110 and reach the light detection means 14*a* through the light guide plate 12a, may be reduced. As a result, the amount of light capable of being detected by the light detection means 41a may be further increased, so that the light that reaches the right side of the image display region 110 may be surely and efficiently detected.

In addition, light that reaches the left side of the image display region 110 is incident on the light guide plate 12b arranged along the left side like the light that reaches the right side, and are totally reflected within the light guide plate 12b and propagated along the left side of the image display region 110 to be incident on the light detection means 14b. Accordingly, the light that reaches the left side of the image display region 110 may be surely and efficiently detected by the light detection means 14b.

In this case, as indicated by the arrow G referring to FIG. 7, external light in addition to the light emitted from the organic EL element 72 is incident on the sealing substrate 20 in the image display region 110. A portion of the external light is internally reflected within the sealing substrate 20 as indicated by arrows H, so that it reaches the right and left sides of the image display region 110 through the sealing substrate 20. The light that reaches the right and left sides of the image display region 110 is then incident on the light guide plates 12a and 12b, respectively, so that it is totally reflected to be propagated within the light guide plates 12a and 12b, which is then detected by the light detection means 14a and 14b, respectively.

As such, all pixel units 70 arranged in the image display region 110 are turned on so that a portion of the external light that reaches the right and left sides of the image display region 110 is detected by any one or both of the light detection means 14a and 14b. By means of this construction, external light components of the light detected by the light detection means 14a and 14b when each pixel unit 70 is turned on, are eliminated, which allows components of the light emitted from the pixel units 70 to be separated.

Next, the operation of the control unit 200 will be described with reference to FIGS. 5 and 8. Each of the light detection means 14a and 14b shown in FIG. 5 generates and outputs a detection signal upon the light detection. In this case, referring to FIG. 1, FIG. 4A, or FIG. 6A, it is assumed that the detection signal output from the light detection means 14a arranged at a right end of the image display region 110 and the detection signal output from the light detection means 14b arranged at a left end of the image display region 110 are first and second detection signals, respectively.

By means of the input timing determined by the timing control unit 202, the first and second detection signals are input to the corresponding control unit 200 through the switch 204, respectively, which are then input to the operating unit 208 through the A/D converter 206. An operation associated with generating the correction signal in the control unit 200 is initiated in response to the input of the first and second detection signals.

In the present embodiment, all pixel units 70 are turned off in advance, so that a portion of the external light incident on the sealing substrate 20 with respect to the image display region 110 is detected by the light detection means 14a and 14b, respectively. The operating unit 208 calculates the intensity a of the detected external light based on each of current values of the first and second detection signals, and stores the intensity value a in the memory 212. In addition, the value a is sometimes referred to as simply the intensity of the external light.

First, referring to FIG. 5, the operating unit 208 calculates the intensity of light detected by the light detection means 14a and 14b based on the current values of the first and second detection signals, and stores the calculated light intensity in the memory 212 (Step S1). The external light components and the components of the light emitted from the R pixel unit 70 are included in the light detected by the light detection means 14a. Accordingly, the light intensity calculated based on the first detection signal becomes the value (a+b1) such that the intensity a of the external light is added with the intensity b1 of light, which is detected by the light detection means 14a, of the light emitted from the R pixel unit 70. In addition, hereinafter, the value (a+b1) is sometimes referred to as a first light intensity.

In addition, the light intensity calculated based on the second detection signal becomes the value (a+b2) such that the intensity a of the external light is added with the intensity b2 of light, which is detected by the light detection means 14b, of the light emitted from the R pixel unit 70. In addition, hereinafter, the value (a+b2) is sometimes referred to as a second light intensity.

The operating unit 208 then reads out the intensity a of the external light, the first light intensity (a+b1), and the second light intensity (a+b2) that are stored in the memory 212, subtracts the intensity a of the external light from the first light intensity (a+b1) and the second light intensity (a+b2), respectively, thereby calculating a first value b1 and a second value b2 (Step S2).

The operating unit 208 then calculates the sum (b1+b2) of the first value b1 and the second value b2, and outputs the value (b1+b2) to the correction signal generating unit 210 as an operation result. In addition, the first value b1, the second value b2, and the operation result (b1+b2) are output from the operating unit 208 and stored in the memory 212.

The correction signal generating unit 210 determines whether the value of the operation result (b1+b2) is constant (Step S3). In this case, the constant value is preferably set in the memory 212 or the correction signal generating unit 210. When the constant value is set in the memory 212, it is taken out from the memory 212 by the correction signal generating unit 210.

The sum of the first value b1 and the second value b2 is constant when the light-emitting state of the R pixel unit 70 is good, however, it becomes different from the constant value because the organic EL element 72 deteriorates. The correction signal generating unit 210 outputs the correction signal to the driving unit 120 (Step S4) when it is determined that the operation result (b1+b2) is not constant (Step S3: NO). A current value of the R image signal is adjusted in the data line driving circuit 150 of the driving unit 120, and the R image signal is supplied to the corresponding R pixel unit 70, so that the light-emitting of the R pixel unit 70 is corrected. As a result, the brightness of the R pixel unit 70 is adjusted. A series of operations associated with generating the correction signal is then terminated in the control unit 200.

On the other hand, the correction signal generating unit 210 does not generate the correction signal when it is determined that the operation result (b1+b2) is constant (Step S3: YES). A series of operations associated with generating the correction signal is then terminated in the control unit 200.

In the series of operations associated with generating the correction signal as described above, the first value b1 and the second value b2 may be used so that the light-emitting state of the R pixel unit 70 may be accurately detected.

In Step S3, instead of determining whether the sum (b1+b2) of the first value b1 and the second value b2 constant, a reference table that is stored in the memory 212 or set in the correction signal generating unit 210 may be used to detect the light-emitting state of the R pixel unit 70. The reference table indicates reference values representing the light-emitting states when each of the plurality of pixel units 70 is in a normal sate, namely, when each of the organic EL elements 72 does not deteriorate. In this case, the correction signal generating unit 210 determines whether any one of the first value b1 and the second value b2 is indicated in the reference table, and generates the correction signal when it is not indicated in the reference table.

In the present embodiment, similar to the R pixel unit 70, the G pixel unit 70 and the B pixel unit 70 are also turned on, so that each brightness may be adjusted. Accordingly, the degree of deterioration of the organic EL element 72 in each of R, G and B pixel units may be detected in the organic EL device 1, which allows brightness of each pixel unit 70 to be corrected.

Alternatively, the correction signal generating unit 210 may generate the correction signal based on the intensity of the external light calculated by the operating unit 208, and the data line driving circuit 150 of the driving unit 120 generates each of three types of R, G, and B image signals based on the correction signal, and these three types of image signals are supplied to the corresponding pixel units 70, so that the brightness of each pixel unit 70 may be adjusted. By means of this construction, the brightness of each pixel unit 70 increases when a large amount of external light is incident on the sealing substrate 20, the brightness decreases when a small amount of external light is incident on the sealing substrate 20.

Accordingly, it is possible to display a high-quality image in the image display region 110 in the present embodiment. In addition, it is possible to fabricate the organic EL device 1 at a low cost as compared to the construction of arranging the light detection means per organic EL element 72 in each pixel unit 70.

<2: Second Embodiment>

The second embodiment according to the electro-optical device of the present invention will be described. A line printer head configured using an organic EL device is described in the second embodiment. The electro-optical device of the second embodiment differs from the first embodiment in that an arrangement pattern of the plurality of pixel unit 70 in the image display region 110 is different from the arrangement pattern of the first embodiment. Accordingly, only a difference will be described with respect to the construction of the organic EL device in the second embodiment with reference to FIG. 9. In addition, same reference numerals will be given to parts common to the first embodiment, so that its description will be omitted.

Figure 9A:
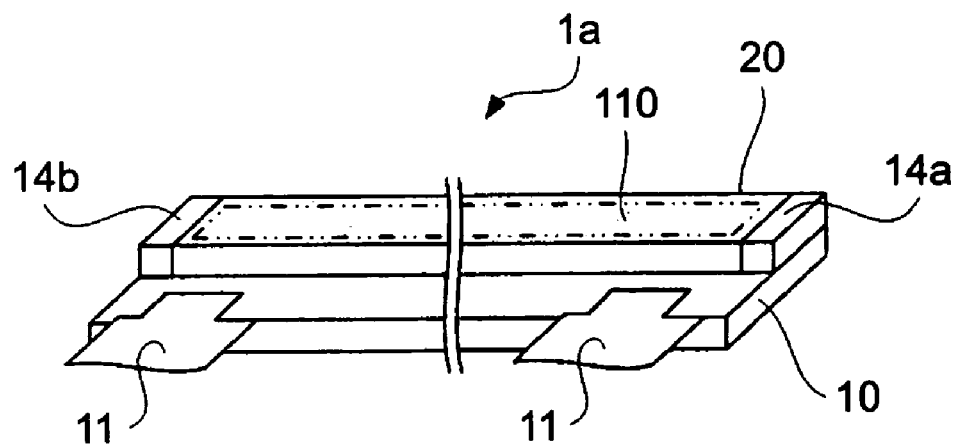
FIG. 9A is a perspective view showing a general construction of an organic EL device in accordance with a second embodiment.
Figure 9B:
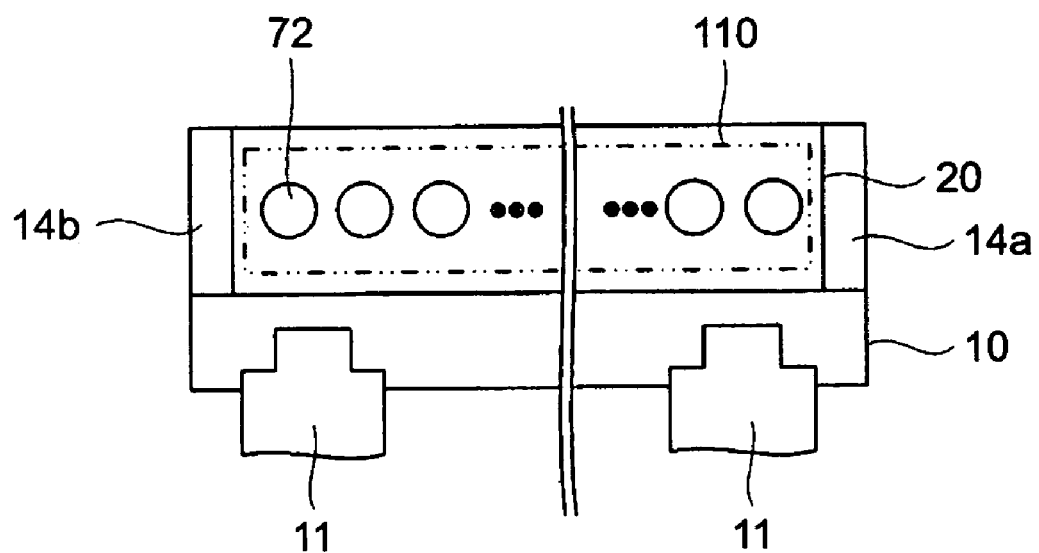
FIG. 9B is a plan view of the organic EL device when an element substrate is viewed from a sealing substrate.

FIG. 9A is a perspective view schematically showing a general construction of an organic EL device, and FIG. 9B is a schematic plan view of the organic EL device when the element substrate 10 is viewed from the sealing substrate 20.

In the present embodiment, the plurality of pixel units 70 in the image display region 110 of the organic EL device 1a are arranged in a line, namely, in one-dimensional pattern. FIG. 9B schematically shows each of the organic EL elements 72 formed in each of pixel units 70. As shown in FIG. 9B, the organic EL elements 72 of the pixel units 70 are arranged in a line when the plurality of pixel units 70 are arranged in a line.

In addition, as shown in FIGS. 9A and 9B, the light detection means 14a and 14b are arranged at right and left sides of the element substrate 10. Each of the light detection means 14a and 14b is disposed along the one side of the sealing substrate 20 adjacent to one side thereof. Accordingly, each of the light detection means 14a and 14b is disposed on the sealing substrate 10 along one side of the image display region 110 corresponding to one side of the adjacent sealing substrate 20.

When the organic EL device 1a operates, each of the pixel units 70 is selectively turned on so that the light emitted from respective pixel units 70 is irradiated on the photoreceptor. An image formed on a surface where the light is radiated on the photoreceptor is developed by a toner so that it is transferred onto a printing sheet by a transcriber. In addition, the photoreceptor and the toner, etc. are not shown in FIGS. 9A and 9B.

When each pixel unit 70 is turned on, the light that reaches the right and left sides of the image display region 110 is emitted from an end face of the sealing substrate 20 along the both sides, and is incident on the light detection means 14a and 14b, respectively, so that it is detected by the light detection means 14a and 14b.

Accordingly, the light guide means such as the light guide plate is not necessary in the second embodiment. In addition, similar to the first embodiment, the brightness of each pixel unit 70 may be adjusted so that a good printing may be carried out. In addition, similar to the first embodiment, the light guide means may be disposed based on the arrangement pattern of the plurality of pixel units 70 in the second embodiment.

<3: Electronic Apparatus>

Figure 10:
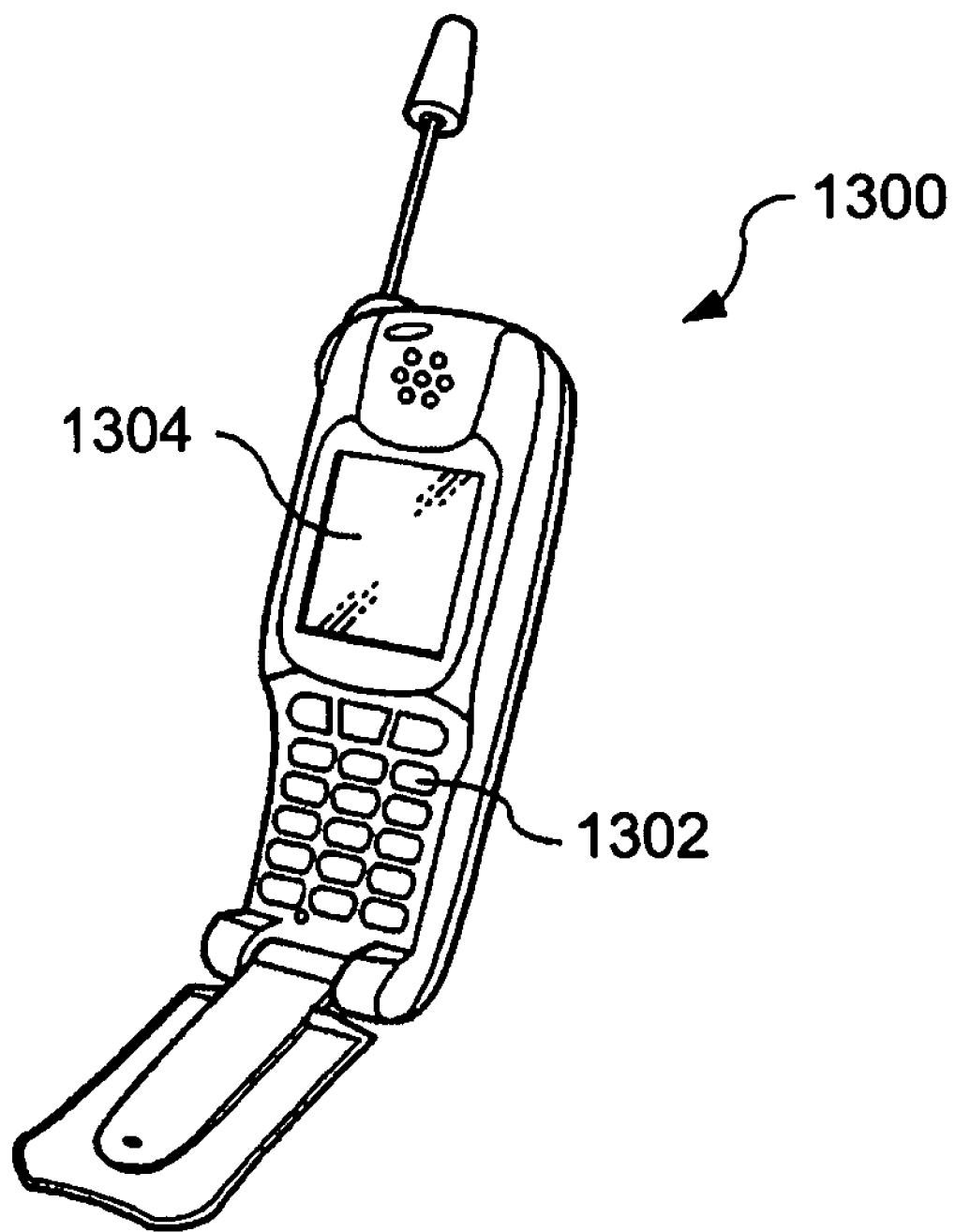
FIG. 10 is a perspective view of a mobile phone as an electronic apparatus.

Next, a description will be made on the case that the above-mentioned electro-optical device is applied to various electronic apparatus. The above-mentioned electro-optical device may be applied to an electronic apparatus. For example, the electro-optical device 1300 may be applied to the mobile phone 1300. The mobile phone 1300 includes an organic EL device having an organic EL panel along with a plurality of operating buttons 1302. In addition, reference numeral 1304 is given to the organic EL panel in FIG. 10.

In addition, the electro-optical device may be applied to a notebook personal computer, a personal digital assistant (PDA), a television, a view finder type or monitor direct view type video tape recorder, a car navigation apparatus, a pager, an electronic note, an electronic calculator, a word processor, a workstation, a point-of-sale (POS) terminal, an apparatus having a touch panel, and so forth.

The present invention is not limited to the above-described embodiments. The present invention can be appropriately modified in a range that goes against the features or ideas of the present invention as may be read throughout the description and claims. An electro-optical device including such a modification, a method for driving the same, and various electronic apparatuses comprising such electro-optical device are included in the technical scope of the present invention.

What is claimed is:

1. An electro-optical device, comprising:
    a plurality of pixel units arranged in a display region being part of a substrate in a predetermined pattern, each including a light-emitting element;
    a plate-like member disposed to overlap the display region and formed of a transparent medium for transmitting light emitted from the plurality of pixel units and internally reflecting a portion of the transmitted light;
    light guide means for guiding light that is internally reflected and emitted from the plate-like member along at least one side; and light detection means disposed on a surface of the subtrate and disposed at one end of the at least one side and detects light guided by the light means along the at least one side.

2. The electro-optical device according to claim 1, wherein the plurality of pixel units are arranged in a plane as the predetermined pattern.

3. The electro-optical device according to claim 1, wherein the plurality of pixel units are arranged in a line as the predetermined pattern.

4. The electro-optical device according to claim 1, wherein the plate-like member is comprised of a sealing substrate for sealing the light-emitting element, and the transparent medium is formed of a transparent material having a smaller refractive index than that of the light guide means.

5. The electro-optical device according to claim 1, further comprising:
   a driving unit for generating a driving signal and for supplying the driving signal to each of the plurality of pixel units to allow each of the plurality of pixel units to emit light when turned on.

6. The electro-optical device according to claim 5, further comprising:
   a control unit for generating a correction signal for correcting light emitting of the pixel units based on a detected signal output by the light detection means, and for supplying the correction signal to the driving unit, wherein the driving unit corrects the driving signal based on the correction signal.

7. The electro-optical device according to claim 6, wherein, of external light incident on the plate-like member when the plurality of pixel units are turned off, the light detection means detects light that is internally reflected in the plate-like member and reaches at least one side of the display region through the inside of the plate-like member.

8. The electro-optical device according to claim 7, wherein the control unit calculates a light intensity detected by the light detection means when the pixel units are turned off and a light intensity detected by the light detection means when the pixel units are turned on, based on the detected signal, and generates the correction signal based on a value obtained by subtracting the light intensity calculated when the pixel units are turned off from the light intensity calculated when the pixel units are turned on.

9. The electro-optical device according to claim 8, wherein the light detection means is disposed at each of two sides of the display region, and the control unit obtains first and second values as values based on each of the detected signals output from the two light detection means, determines whether or not the sum of the first and second values is constant, and generates the correction signal when it is determined that the sum is not constant.

10. An electronic apparatus comprising the electro-optical device according to claim 1.

11. A method for driving an electro-optical device including a plurality of pixel units arranged in a display region being part of a substrate in a predetermined pattern, each including a light-emitting element, and a plate-like member disposed to overlap the display region and formed of a transparent medium for transmitting light emitted from each of the pixel units and reflecting a portion of the transmitted light, the method comprising the steps of:
   detecting, via a light detection mean, light that is internally reflected and reaches at least one side of the display region through the inside of the plate-like member, the light guided by a light guide means and emitted from the plate-like member along the at least one side, the light detection means disposed on a surface of the substrate and disposed at one end of the at least one side and detecting the light guided by the light guide means along the at least one side;
   generating a correction signal for correcting light emitting of each of the pixel units based on the amount of detected light; and
   generating a driving signal for allowing each of the pixel units to be turned on to emit light based on the correction signal.

* * * * *